United States Patent
Hwang et al.

(10) Patent No.: US 9,349,858 B2
(45) Date of Patent: May 24, 2016

(54) SEMICONDUCTOR DEVICE AND METHOD OF FABRICATING THE SAME

(71) Applicant: SAMSUNG ELECTRONICS CO., LTD., Suwon-si (KR)

(72) Inventors: HeeDon Hwang, Yongin-si (KR); JuEun Kim, Hwaseong-si (KR); KiHong Nam, Seongnam-si (KR); BongHyun Kim, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 219 days.

(21) Appl. No.: 14/028,969

(22) Filed: Sep. 17, 2013

(65) Prior Publication Data

US 2014/0077294 A1    Mar. 20, 2014

(30) Foreign Application Priority Data

Sep. 17, 2012  (KR) .................. 10-2012-0102906

(51) Int. Cl.
| H01L 29/78 | (2006.01) |
| H01L 29/66 | (2006.01) |
| H01L 29/51 | (2006.01) |
| H01L 21/28 | (2006.01) |
| H01L 29/423 | (2006.01) |
| H01L 29/49 | (2006.01) |

(52) U.S. Cl.
CPC ...... *H01L 29/7827* (2013.01); *H01L 21/28114* (2013.01); *H01L 29/4236* (2013.01); *H01L 29/42376* (2013.01); *H01L 29/4983* (2013.01); *H01L 29/51* (2013.01); *H01L 29/66621* (2013.01); *H01L 29/66666* (2013.01); *H01L 29/78* (2013.01)

(58) Field of Classification Search
USPC .......................................... 257/330; 438/270
See application file for complete search history.

(56) References Cited

U.S. PATENT DOCUMENTS

| 7,166,891 | B2 | 1/2007 | Yoshimochi |
| 7,741,180 | B2 | 6/2010 | Yamazaki |
| 7,964,913 | B2 * | 6/2011 | Darwish ....................... 257/330 |
| 8,012,828 | B2 | 9/2011 | Min et al. |
| 2011/0068395 | A1 | 3/2011 | Hebert |
| 2011/0241106 | A1 | 10/2011 | Lee et al. |
| 2013/0249602 | A1 * | 9/2013 | Mauder ............... H01L 29/7801 327/108 |

FOREIGN PATENT DOCUMENTS

| JP | 2009-224365 A | 10/2009 |
| KR | 10-2011-0070318 A | 6/2011 |
| KR | 10-1075529 B1 | 10/2011 |
| KR | 10-2011-0118981 A | 11/2011 |
| KR | 10-1094956 B1 | 12/2011 |

* cited by examiner

*Primary Examiner* — Monica D Harrison
(74) *Attorney, Agent, or Firm* — Sughrue Mion, PLLC

(57) ABSTRACT

Provided are a semiconductor device and a method of fabricating the same. The semiconductor device comprises a first trench formed in a substrate; a first insulating film formed on sidewalls and a bottom surface of the first trench and not formed on a top surface of the substrate; and a first conductive film formed on the first insulating film to partially fill the first trench, wherein the first insulating film comprises a first portion which overlaps the first conductive film and a second portion which does not overlap the first conductive film, wherein the second portion comprises first fixed charges.

19 Claims, 18 Drawing Sheets

SEMICONDUCTOR DEVICE AND METHOD OF FABRICATING THE SAME

CROSS-REFERENCE TO RELATED APPLICATIONS

This U.S. non-provisional patent application claims priority from Korean Patent Application No. 10-2012-0102906, filed on Sep. 17, 2012, in the Korean Intellectual Property Office, the entire contents of which are hereby incorporated by reference.

BACKGROUND

1. Field

Exemplary embodiments relate to a semiconductor device and a method of fabricating the same, and more particularly, to a transistor having a buried channel and a method of fabricating the same.

2. Description of the Related Art

A buried channel array transistor (BCAT) includes a gate electrode buried in a trench. Thus, it can overcome a short-channel effect. Characteristics of the BCAT may change according a depth to which the gate electrode is buried from the surface of a substrate. For example, gate-induced drain leakage (GIDL) and the amount of current may change.

SUMMARY

Aspects of the exemplary embodiments provide a semiconductor device having both improved current amount characteristics and improved gate-induced drain leakage (GIDL) characteristics.

Aspects of the exemplary embodiments also provide a method of fabricating a semiconductor device having both improved current amount characteristics and improved GIDL characteristics.

However, aspects of the exemplary embodiments are not restricted to the one set forth herein. The above and other aspects of the exemplary embodiments will become more apparent to one of ordinary skill in the art to which the exemplary embodiments pertains by referencing the detailed description of the exemplary embodiments given below.

According to an aspect of the present exemplary embodiments, there is provided a semiconductor device including: a first trench formed in a substrate; a first insulating film formed on sidewalls and a bottom surface of the first trench and not formed on a top surface of the substrate; and a first conductive film formed on the first insulating film to partially fill the first trench, wherein the first insulating film includes a first portion which overlaps the first conductive film and a second portion which does not overlap the first conductive film, wherein the second portion includes first fixed charges.

According to another aspect of the present exemplary embodiments, there is provided a semiconductor device including: an element isolation region defining an active region; and a transistor formed in the active region, wherein the transistor includes a first trench, a first insulating film formed on sidewalls and a bottom surface of the first trench and not formed on a top surface of a substrate, and a first gate electrode formed on the first insulating film to partially fill the first trench, and the element isolation region includes a second trench, a second insulating film formed on sidewalls and a bottom surface of the second trench and not formed on the top surface of the substrate, and a third insulating film formed on the second insulating film to fill the second trench, wherein the first insulating film includes a first portion which overlaps the first gate electrode and a second portion which does not overlap the first gate electrode, wherein the second portion includes first fixed charges, and at least part of the second insulating film includes second fixed charges.

According to still another aspect of the present exemplary embodiments, there is provided a semiconductor device including: a unit active region formed in a substrate and extending in a first direction; and first and second transistors including first and second gate electrode structures which are formed in the substrate and extend in a second direction that forms an acute angle with the first direction to cross the unit active region, a first source/drain region which is formed in the substrate between the first and second gate electrode structures, and a second source/drain region which is formed on the other side of each of the first and second gate electrode structures from the first source/drain region, wherein the first gate electrode structure includes a first trench formed in the substrate, a first insulating film formed on sidewalls of the first trench and not formed on a top surface of the substrate, and a first gate electrode formed on the first insulating film to partially fill the first trench, wherein the first insulating film includes a first portion which overlaps the first gate electrode and a second portion which does not overlap the first gate electrode, wherein the second portion includes first fixed charges.

According to still another aspect of the present exemplary embodiments, there is provided a semiconductor device including: a first trench formed in a substrate; a first insulating film formed on sidewalls and a bottom surface of the first trench and not formed on a top surface of the substrate; and a first conductive film formed on the first insulating film to partially fill the first trench, wherein the first insulating film includes a first portion which overlaps the first conductive film and a second portion which does not overlap the first conductive film, wherein the second portion includes nitrogen charges According to an aspect of the present exemplary embodiments, there is provided a method of fabricating a semiconductor device, the method including: forming a mask pattern on a substrate; forming a first trench using the mask pattern; forming a first insulating film along a top surface and side surfaces of the mask pattern and side surfaces and a bottom surface of the first trench; forming a first conductive film in the first trench to partially fill the first trench; forming first fixed charges in a second portion of the first insulating film; and removing the mask pattern, wherein the first insulating film includes a first portion which overlaps the first conductive film and the second portion which does not overlap the first conductive film.

In an exemplary embodiment, there is a semiconductor device including: a substrate including a source and drain region; a trench disposed adjacent to the source and drain region; an insulating film disposed inside the trench; a gate electrode disposed at a lower portion of the trench, wherein the insulating film includes fixed charges, the fixed charges being inserted into or formed in the insulating film, and wherein the electrical field induced from the fixed charges reduces leakage current in the source and drain region.

The substrate further includes a body and wherein the leakage current is gate induced drain leakage current or junction leakage current between a drain of the source and drain region and the body.

The fixed charges are vertically disposed in the insulating film up to a top of the trench and not disposed over the source and drain region.

The insulating film includes a first portion and a second portion disposed above the first portion, and wherein the fixed charges are disposed in the second portion which extends toward a top of the gate electrode.

The insulating film lines an inside of the trench.

The trench extends through the source and drain region of the substrate and extends further into the substrate beneath the source and drain region.

The top of the gate extends vertically to overlap with the source and drain region of the substrate.

The semiconductor device may further include a cap film disposed over the gate electrode.

The semiconductor device may further include a cap film disposed over the gate electrode, wherein the insulating film includes a first insulating film and a second insulating film, the second insulating film lining an inside surface of the first insulating film and a lower portion of the second insulating film disposed between the gate electrode and the cap, and wherein the second insulating film includes the fixed charges.

The first insulating portion includes a first portion and a second portion disposed above the first portion, wherein the second insulating film lines the inside surface of the second portion of the first insulating film, and wherein a thickness of the second portion of the first insulating film is less than a thickness of the first portion of the first insulating film disposed below the second portion.

The first insulating portion includes a first portion and a second portion disposed above the first portion, wherein the second insulating film lines the inside surface of the second portion of the first insulating film, and wherein a thickness of the second portion of the first insulating film is substantially equal to a thickness of the first portion of the first insulating film disposed below the second portion.

A cross-sectional shape of the first portion of the insulating film is bulbous-shaped.

The cap includes: a high-k portion and a low-k portion disposed on the high-k portion.

The insulating film includes the fixed charges from the top of the source and drain region of the substrate to a depth d.

In yet another exemplary embodiment, the trench is a first trench, the insulating film is an inner insulating film, and the fixed charges are inner fixed charges and the semiconductor device further includes: an outer trench, the inner trench being disposed in the outer trench, and an outer insulating film lining an inside surface of the outer trench.

The outer insulating film includes outer fixed charges inserted into or formed in the outer insulating film.

The outer fixed charges are inserted into the outer insulating film using plasma or formed by depositing a material to form a film including the fixed charges.

In one exemplary embodiment, the fixed charges comprise at least one material selected from N, Hf, Zr, La, Mg, B, Al, P, As, Ar and H.

In an exemplary embodiment, there is a method of fabricating a semiconductor device, the method including: forming a mask on a substrate; forming a trench in the substrate based on the mask; forming an insulating layer inside the trench, the insulating layer including fixed charges, the forming the insulating layer including: inserting fixed charges into the insulating layer using plasma, or forming the insulating layer including the fixed charges; forming an electrode gate at bottom of the trench, a top of the electrode gate being below a top surface of the substrate; and blocking at least a portion of a leakage current in the source and drain region through an electrical field induced by the fixed charges.

The leakage current is gate induced drain leakage current or junction leakage current between a drain of the source and drain region and the body.

The fixed charges are vertically disposed in the insulating film up to a top of the trench and not disposed over a source and drain region of the substrate.

A cap formed above the gate electrode in the second portion of the insulating layer.

The fixed charges include at least one material selected from N, Hf, Zr, La, Mg, B, Al, P, As, Ar and H.

The insulating layer includes a first insulating layer and a second insulating layer, the first insulating layer including a first portion and a second portion disposed above the first portion, and the second insulating layer including the fixed charges, the method further including: partially etching the first insulating layer so that a thickness of the second portion is less than a thickness of the first portion.

BRIEF DESCRIPTION OF THE DRAWINGS

The above and other aspects and features of the exemplary embodiments will become more apparent by describing in detail exemplary embodiments thereof with reference to the attached drawings, in which.

DETAILED DESCRIPTION OF THE EXEMPLARY EMBODIMENTS

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known methods, procedures, components, and circuitry have not been described in detail to avoid unnecessarily obscuring aspects of the present invention.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
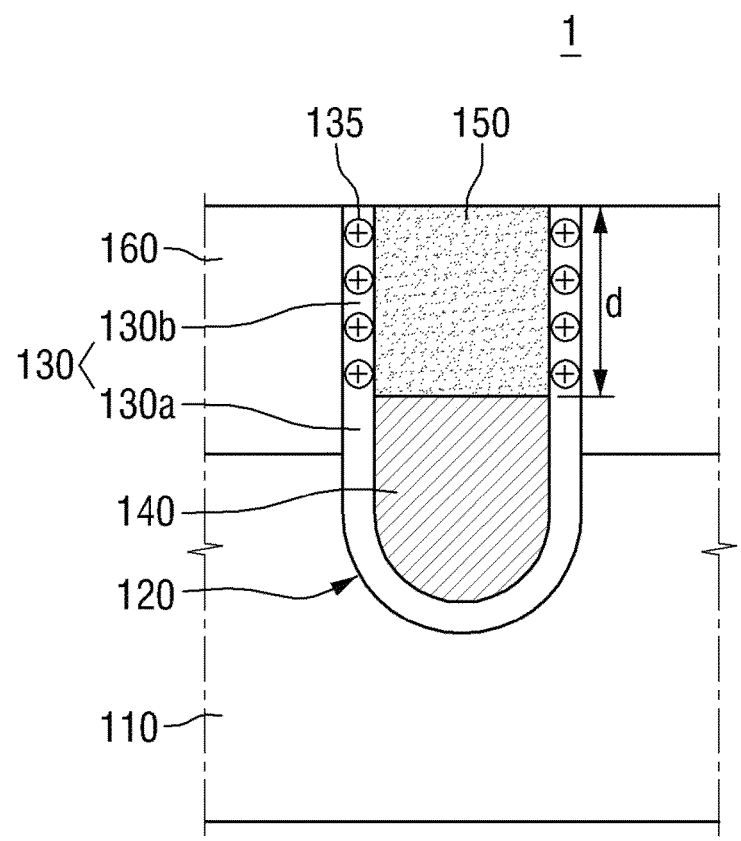
FIG. 1 is a cross-sectional view of a semiconductor device 1 according to a first embodiment.

FIG. 1 is a cross-sectional view of a semiconductor device 1 according to a first embodiment.

Referring to FIG. 1, the semiconductor device 1 according to the first embodiment of the present exemplary embodiments may include a substrate 110, a first trench 120, a first insulating film 130, a first gate electrode (a first material film) 140, first fixed charges 135, a first source/drain region 160, and a capping film 150.

The substrate 110 may be, but is not limited to, a stack of a base substrate and an epitaxial layer. The substrate 110 may be a silicon substrate, a gallium arsenide substrate, a silicon germanium substrate, a ceramic substrate, a quartz substrate, a glass substrate for displays, or a silicon-on-insulator (SOI) substrate. A silicon substrate will hereinafter be described as an example of the substrate 110. The substrate 110 may have, but not limited to, a first conductivity type (e.g., a P type).

The first trench 120 is formed in the substrate 110. The first trench 120 may have various shapes. For example, connection portions between a bottom surface and sidewalls of the first trench 120 may be round as shown in the drawing. Alternatively, the sidewalls of the first trench 120 may slope at a predetermined angle.

The first insulating film 130 may be formed along the sidewalls and bottom surface of the first trench 120. The first insulating film 130 may include at least one of a silicon oxide film, a silicon nitride film, a silicon oxynitride film, and a high-k material. The high-k material may include at least one of $HfO_2$, $ZrO_2$, and $Ta_2O_5$.

The first insulating film 130 is not formed on a top surface of the substrate 110. As will be described later with reference to FIGS. 16 through 20, a mask pattern 199 (see FIG. 16) may be formed on the substrate 110, the first trench 120 may be formed, and the first insulating film 130 may be formed on a top surface and sidewalls of the mask pattern 199 and the sidewalls and bottom surface of the first trench 120. Then, when the mask pattern 199 is removed, the first insulating film 130 formed on the top surface of the mask pattern 199 may also be removed. This is why the first insulating film 130 does not exist on the top surface of the substrate 110.

The first gate electrode 140 may be formed in the first trench 120 to fill the first trench 120 not completely but partially. That is, the first gate electrode 140 may be in a recessed form. A top surface of the first gate electrode 140 may be lower than the top surface (a surface) of the substrate 110. The first gate electrode 140 may be made of, but not limited to, a conductive material such as metal or polysilicon. In the present specification, a case where the first gate electrode 140 is a metal will be described as an example.

The capping film 150 may be formed on the first gate electrode 140 to fill the first trench 120. The capping film 150 may be, but is not limited to, an oxide film, a nitride film, or an oxynitride film. In the present specification, a case where the capping film 150 is a nitride film will be described as an example.

The first source/drain region 160 may be formed in the substrate 110 on both sides of the first trench 120. For example, when the semiconductor device 1 according to the first embodiment is an N-type transistor, the first source/drain region 160 may be doped with N-type impurities. As shown in the drawing, the first source/drain region 160 may be formed to partially overlap the first gate electrode 140.

In the semiconductor device 1 according to the first embodiment of the present exemplary embodiments, the first insulating film 130 includes a first portion 130a which overlaps the first gate electrode 140 and a second portion 130b which does not overlap the first gate electrode 140. The second portion 130b may include the first fixed charges 135, whereas the first portion 130a does not include the first fixed charges 135.

"Fixed charges" mentioned herein are not fixed charges naturally inherent in an insulating film as a result of a process but are fixed charges generated by an intentional process. For example, if the first insulating film 130 is thermally grown $SiO_2$, the amount of fixed charges inherent in an interface between the $SiO_2$ and the substrate 110 (Si) may be 1E11 ea/cm2 or less, more specifically, approximately 5E10 ea/cm2. In the current embodiment, since the first fixed charges 135 are generated in the first insulating film 130 through an intentional process, the amount of the first fixed charges 135 in the first insulating film 130 may be 1E11 ea/cm2 or less, more specifically, approximately 2E11 ea/cm2.

The first fixed charges 135 may include, but not limited to, at least one material selected from the group consisting of N, Hf, Zr, La, Mg, B, Al, P, As, Ar and H. For example, the second portion 130b which includes N may be SiN, SiON, or SiBN. In the present specification, if the second portion 130b includes certain charges (e.g., nitrogen charges), it means that the nitrogen charges have been injected into the second portion 130b through an intentional process. The first fixed charges 135 may be formed in the second portion 130b by using plasma that contains any of the above example elements or by forming a thin film that contains any of the above example elements on the first insulating film 130. Although Ar and H are inert elements, if bonds are broken, dangling bonds are formed. Therefore, Ar and H can be used to form the first fixed charges 135. The first fixed charges 135 may be positive or negative charges. When the semiconductor device 1 according to the first embodiment is an N-type transistor, a Group 3 element such as B or Al may be used as the first fixed charges 135. When the semiconductor device 1 according to the first embodiment is a P-type transistor, a Group 5 element such as P or As may be used as the first fixed charges 135.

Since the first portion 130a and the second portion 130b form the first insulating film 130, a sidewall profile of the first portion 130a may be connected to that of the second portion 130b.

The first fixed charges 135 can maximize both gate-induced drain leakage (GIDL) characteristics and current amount characteristics of a buried channel array transistor (BCAT).

Specifically, characteristics of a BCAT may change according to a length d by which the first gate electrode 140 is recessed (or a length d from the surface of the substrate 110 to the top surface of the first gate electrode 140). For example, the GIDL characteristics and the current amount characteristics may change according to the length d by which the first gate electrode 140 is recessed. A large length d may improve the GIDL characteristics while deteriorating the current amount characteristics. Conversely, a small length d may deteriorate the GIDL characteristics while improving the current amount characteristics. For this reason, it has been impossible to maximize both the GIDL characteristics and the current amount characteristics. Therefore, the length d had to be adjusted such that both the GIDL characteristics and the current amount characteristics were at acceptable levels.

However, if the BCAT is an N-type transistor and if the first fixed charges 135 are positive charges, the first fixed charges 135 may reduce a field between a contact (not shown) connected to the first source/drain region 160 and the first gate electrode 140. That is, the GIDL characteristics can be improved by reducing a leakage current.

Therefore, in the semiconductor device 1 according to the first embodiment of the present exemplary embodiments, the amount of current can be maximized by adjusting the length d, and the GIDL characteristics can be improved using the first fixed charges 135.

Figure 2:
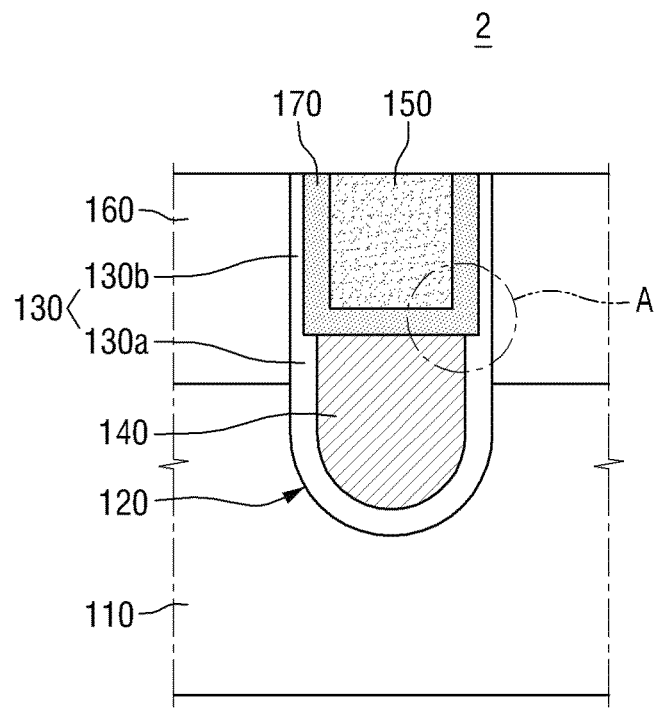
FIG. 2 is a cross-sectional view of a semiconductor device 2 according to a second embodiment.
Figure 3:
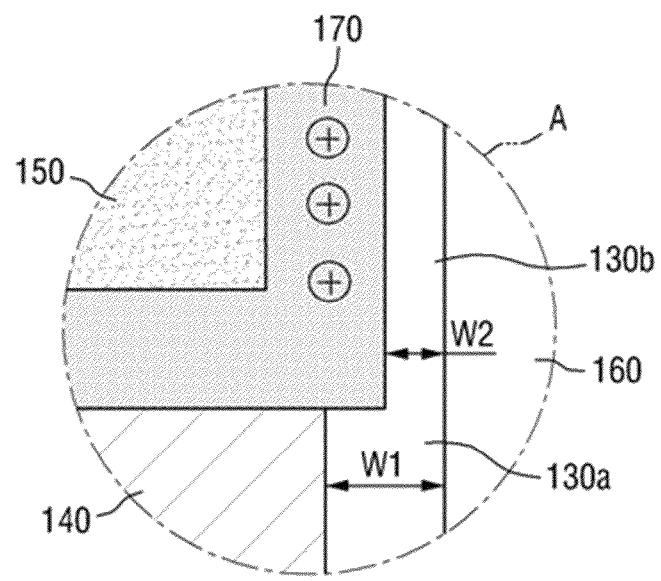
FIG. 3 is an enlarged view of a region 'A' shown in FIG. 2.

FIG. 2 is a cross-sectional view of a semiconductor device 2 according to a second embodiment. FIG. 3 is an enlarged view of a region 'A' shown in FIG. 2. For simplicity, the following description will focus on differences from FIG. 1.

Referring to FIG. 2, in the semiconductor device 2 according to the second embodiment of the present exemplary embodiments, a first insulating film 130 includes a first portion 130a having a first thickness W1 and a second portion 130b having a second thickness W2. As shown in the drawing, the first thickness W1 may be greater than the second thickness W2. Part of the second portion 130b may be etched. Therefore, a sidewall profile of the first portion 130a and a sidewall profile of the second portion 130b may be discontinuous.

The first portion 130a overlaps a first gate electrode 140, and the second portion 130b does not overlap the first gate electrode 140. The second portion 130b includes first fixed charges 135, and the first portion 130a does not include the first fixed charges 135.

A second insulating film 170 may be disposed between the first insulating film 130 and a capping film 150. The second insulating film 170 may be conformally formed along a top surface of the first gate electrode 140 and part of each sidewall of the first insulating film 130. The second insulating film 170 may be a thin film which includes at least one material selected from the group consisting of N, Hf, Zr, La, Mg, B, Al, P, As, Ar and H. For example, a thin film which includes N may be SiN, SiON, or SiBN. By forming the second insulating film 170 along the first insulating film 130, the first fixed charges 135 may be formed in the first insulating film 130.

The second portion 130b of the first insulating film 130 may be formed thin, so that the first fixed charges 135 can be easily formed in the second portion 130b.

Figure 4:
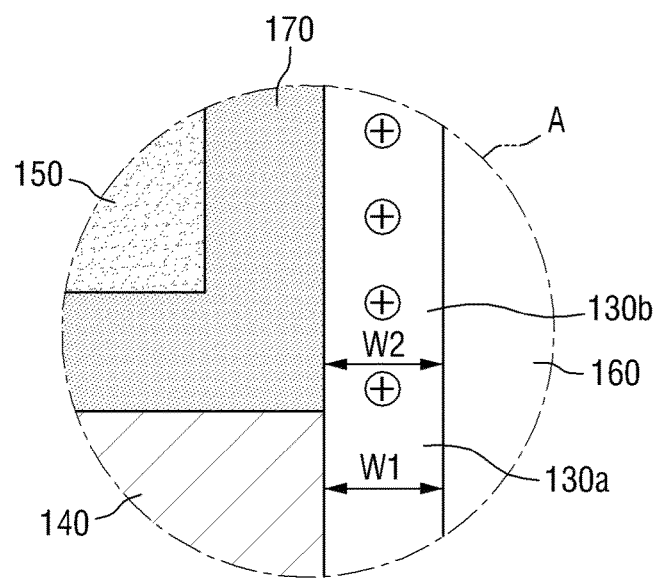
FIG. 4 is a cross-sectional view of a semiconductor device 3 according to a third embodiment.

FIG. 4 is a cross-sectional view of a semiconductor device 3 according to a third embodiment. For simplicity, the following description will focus on differences from FIGS. 2 and 3.

Referring to FIG. 4, in the semiconductor device 3 according to the third embodiment of the present exemplary embodiments, a first insulating film 130 includes a first portion 130a having a first thickness W1 and a second portion 130b having a second thickness W2. The first thickness W1 may be substantially equal to the second thickness W2.

A second insulating film 170 may be disposed between the first insulating film 130 and a capping film 150. The second insulating film 170 may be conformally formed along a top surface of the first gate electrode 140 and part of each sidewall of the first insulating film 130.

When a sufficient amount of first fixed charges 135 can be formed in the second portion 130b even if the second thickness W2 of the second portion 130b is not small, there is no need to reduce the second thickness W2 of the second portion 130b.

Figure 5:
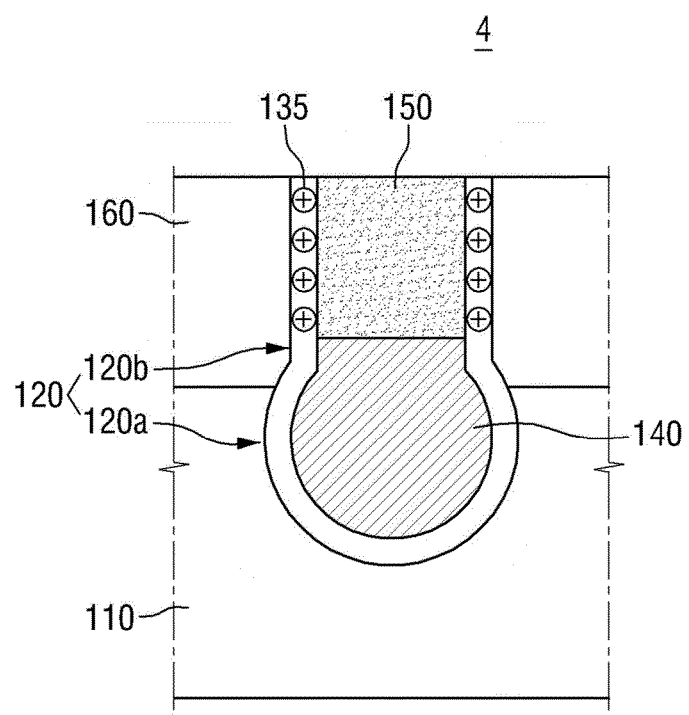
FIG. 5 is a cross-sectional view of a semiconductor device 4 according to a fourth embodiment.

FIG. 5 is a cross-sectional view of a semiconductor device 4 according to a fourth embodiment. For simplicity, the following description will focus on differences from FIG. 1.

Referring to FIG. 5, in the semiconductor device 4 according to the fourth embodiment of the present exemplary embodiments, a first trench 120 includes a ball-shaped first portion 120a and a pillar-shaped second portion 120b. The ball-shaped first portion 120a can prevent an electric field from being concentrated at corners of the first trench 120 and can extend a channel length.

Figure 6:
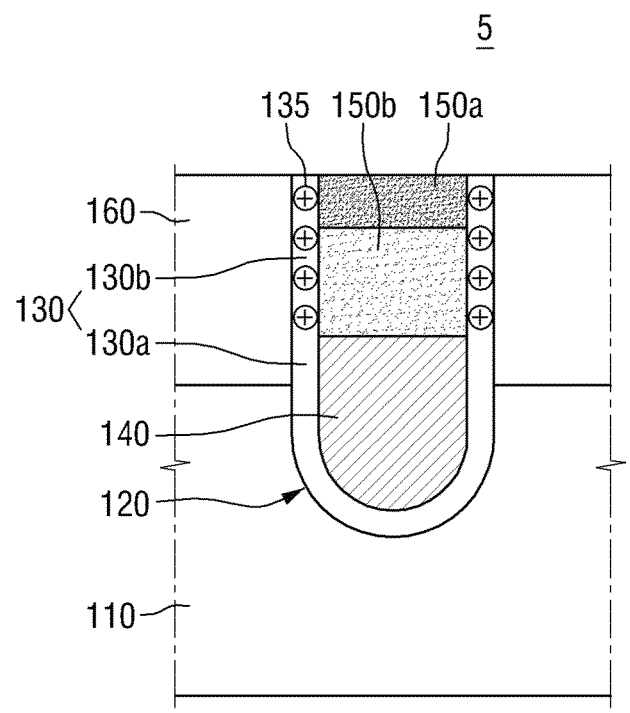
FIG. 6 is a cross-sectional view of a semiconductor device 5 according to a fifth embodiment.

FIG. 6 is a cross-sectional view of a semiconductor device 5 according to a fifth embodiment. For simplicity, the following description will focus on differences from FIG. 1.

Referring to FIG. 6, in the semiconductor device 5 according to the fifth embodiment of the present exemplary embodiments, a capping film 150 may be a stack of a high-k film 150a and a low-k film 150b. Specifically, the high-k film 150a is formed on a first gate electrode 140, and the low-k film 150b is formed on the high-k film 150a. The low-k film 150b may have a dielectric constant of, e.g., 3 or less. The low-k film 150b may include, e.g., an oxide film. The high-k film 150a may have a dielectric constant of 10 or higher. The high-k film 150a may include any one of $ZrO_2$, $TaO_2$, and $TiO_2$. Since the low-k film 150b can reduce an electric field on a surface of a substrate 110, it can reduce leakage current.

Figure 7:
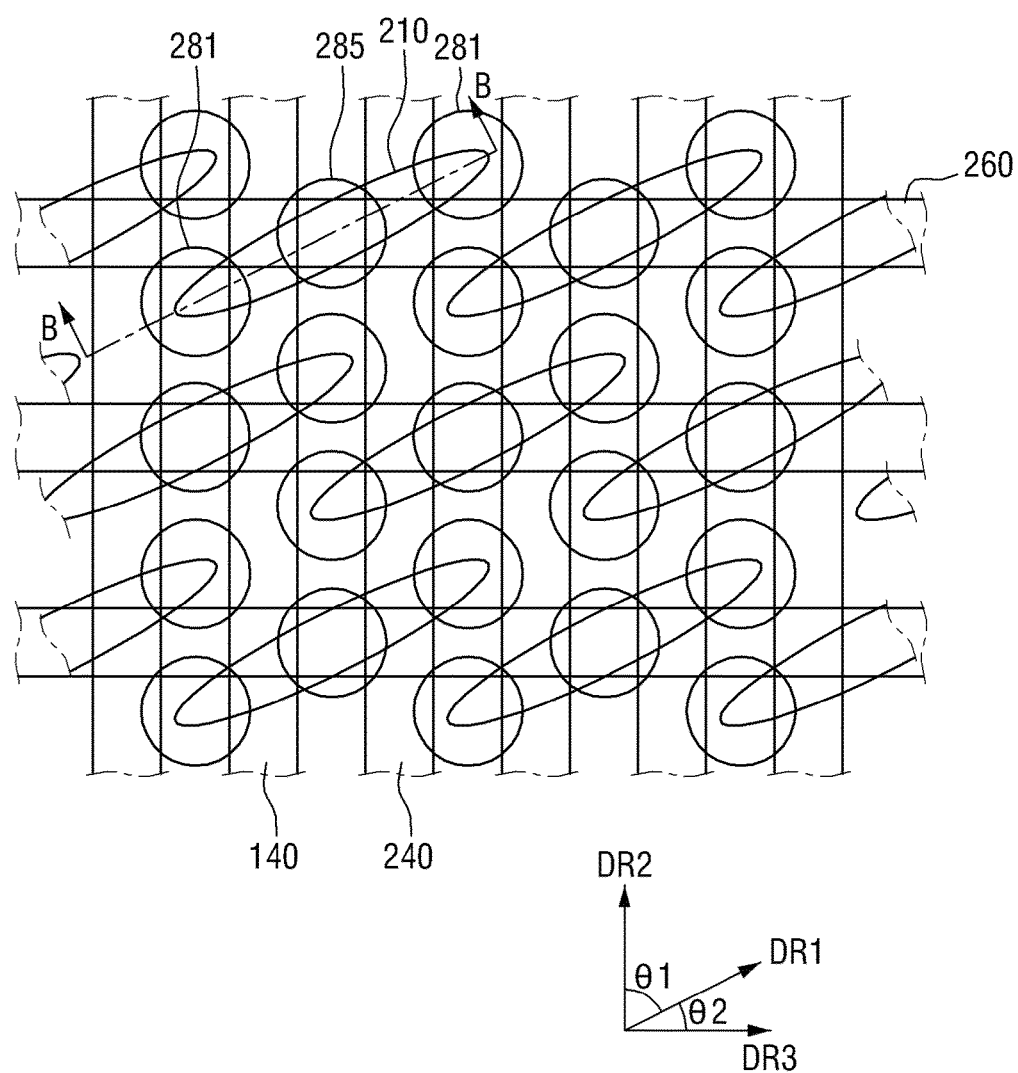
FIG. 7 is a layout view of a semiconductor device 6 according to a sixth embodiment.
Figure 8:
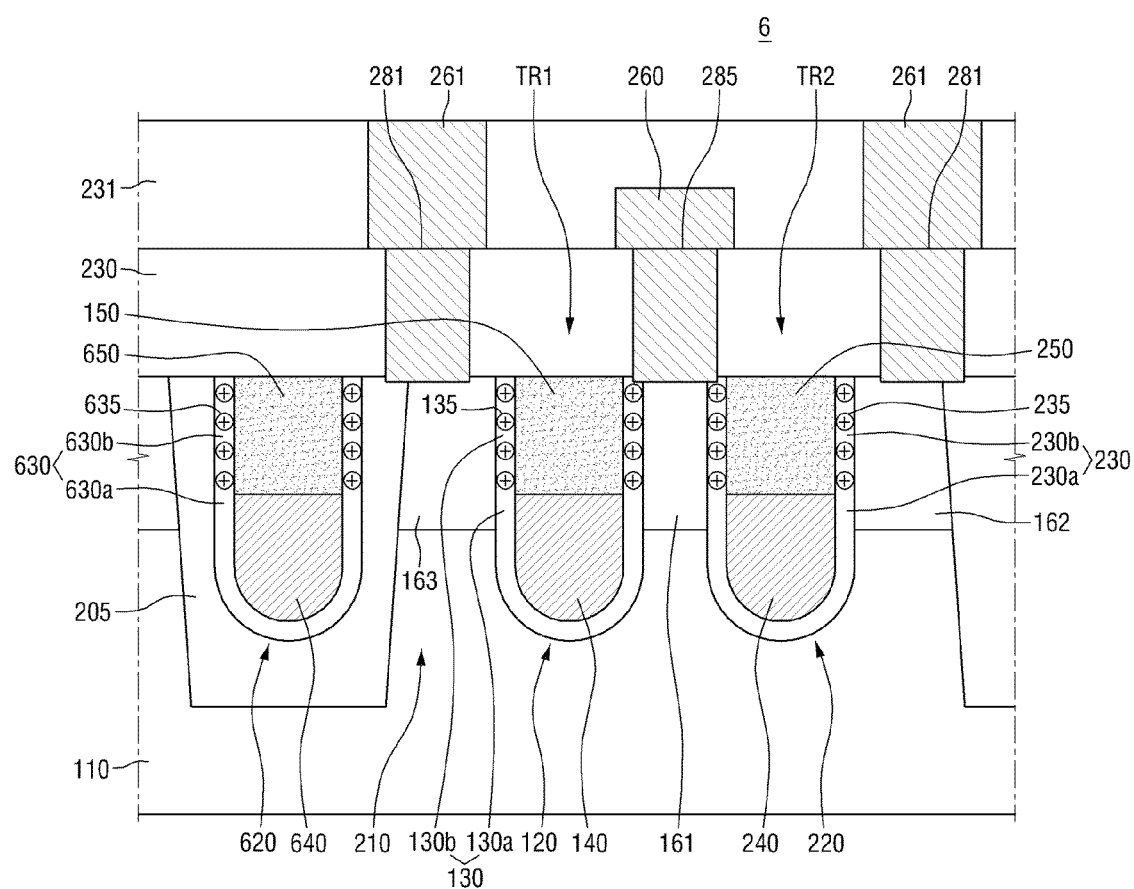
FIG. 8 is a cross-sectional view taken along the line B-B of FIG. 7.

FIG. 7 is a layout view of a semiconductor device 6 according to a sixth embodiment. FIG. 8 is a cross-sectional view taken along the line B-B of FIG. 7. In the drawings, a dynamic random access memory (DRAM) is shown as an example of the semiconductor device 6 according to the sixth embodiment. However, the semiconductor device 6 according to the sixth embodiment is not limited to the DRAM.

Referring to FIGS. 7 and 8, in the semiconductor device 6 according to the sixth embodiment of the present exemplary embodiments, a unit active region 210 is defined by an element isolation region 205 formed in a substrate 110. Specifically, the unit active region 210 may extend in a first direction DR1, a gate electrode (i.e., a word line) 140 extends in a second direction DR2 which forms an acute angle with the first direction DR1, and a bit line 260 extends in a third direction DR3 which forms an acute angle with the first direction DR1.

An angle formed by a direction and another direction may denote a smaller one of two angles formed by intersection of two directions. For example, if angles formed by intersection of two directions are 120 and 60 degrees, the angle may be 60 degrees. Referring to FIG. 7, an angle formed by the first direction DR1 and the second direction DR2 is θ1, and an angle formed by the first direction DR1 and the third direction DR3 is θ2.

The angle θ1 and/or the angle θ2 may be an acute angle in order to maximize a gap between a bit line contact 285 which connects the unit active region 210 and the bit line 260 and a storage node contact 281 which connects the unit active region 210 and a capacitor (not shown). Here, θ1 and θ2 may be, but are not limited to, 45 and 45 degrees, 30 and 60 degrees, or 60 and 30 degrees, respectively.

Referring to FIG. 8, two access transistors TR1 and TR2 may be formed in one unit active region 210. Specifically, the two access transistors TR1 and TR2 may include two gate electrodes (i.e., a first gate electrode 140 and a second gate electrode 240) which cross one unit active region 210, a second source/drain region 161 which is formed in the unit active region 210 between the two gate electrodes 140 and 240, and third source/drain regions 162 and 163 which are formed on the other sides of the two gate electrodes 140 and 240 from the second source/drain region 161. That is, the two access transistors TR1 and TR2 share the second source/drain region 161 but do not share the third source/drain regions 162 and 163.

As described above, a first insulating film 130 may be formed along sidewalls and a bottom surface of a first trench 120 formed in the substrate 110. The first insulating film 130 is not formed on a top surface of the substrate 110. The first gate electrode 140 may be formed in the first trench 120 to fill the first trench 120 not completely but partially. That is, the first gate electrode 140 may be in a recessed form. The first gate electrode 140 may be a conductive material such as metal or polysilicon. A capping film 150 may be formed on the first gate electrode 140 to fill the first trench 120.

The first insulating film 130 includes a first portion 130a which overlaps the first gate electrode 140 and a second portion 130b which does not overlap the first gate electrode 140. The second portion 130b may include first fixed charges 135, whereas the first portion 130a does not include the first fixed charges 135. The first fixed charges 135 may include, but not limited to, at least one material selected from the group consisting of N, Hf, Zr, La, Mg, B, Al, P, As, Ar and H.

A third insulating film 230 may be formed along sidewalls and a bottom surface of a second trench 220 formed in the substrate 110. The third insulating film 230 is not formed on the top surface of the substrate 110. The second gate electrode 240 may be formed in the second trench 220 to fill the second trench 220 not completely but partially. That is, the second gate electrode 240 may be in a recessed form. The second gate electrode 240 may be a conductive material such as metal or polysilicon. A capping film 250 may be formed on the second gate electrode 240 to fill the second trench 220.

The third insulating film 230 includes a third portion 230a which overlaps the second gate electrode 240 and a fourth portion 230b which does not overlap the second gate electrode 240. The fourth portion 230b may include second fixed charges 235, whereas the third portion 230a does not include the second fixed charges 235. The second fixed charges 235 may include, but not limited to, at least one material selected from the group consisting of N, Hf, Zr, La, Mg, B, Al, P, As, Ar and H. The second fixed charges 235 may be identical to the first fixed charges 135.

The bit line contact 285 is formed on the second source/drain region 161, and the storage node contact 281 is formed on each of the third source/drain regions 162 and 163. An interlayer insulating film 230 may be formed around the bit line contact 285 and the storage node contact 281. The bit line 260, contact plugs 261, and an inter-metal insulating film 231 may be formed on the interlayer insulating film 230, the bit line contact 285, and the storage node contact 281. Although not shown in the drawing, a capacitor may further be formed on each of the contact plugs 261.

In the semiconductor device 6 according to the sixth embodiment of the present exemplary embodiments, the amounts of current of the first and second transistors TR1 and TR2 may be maximized, and the GIDL characteristics can be improved using the first fixed charges 135 and the second fixed charges 235.

In FIGS. 7 and 8, the semiconductor device of FIG. 1 is applied to the first and second transistors TR1 and TR2. However, the present exemplary embodiments are not limited thereto. That is, the semiconductor devices described above with reference to FIGS. 2 through 6 are also applicable.

Referring to FIG. 8, the element isolation region 205 defines the unit active region 210. A passing gate structure may be formed in the element isolation region 205. The passing gate structure crosses a unit active region which is different from the unit active region 210 that the first gate electrode 140 and the second gate electrode 240 cross.

Specifically, the passing gate structure may include a fifth trench 620, an eighth insulating film 630, a fourth gate electrode 640, and fifth fixed charges 635.

The fifth trench 620 is formed in the element isolation region 205. The eighth insulating film 630 may be formed on sidewalls and a bottom surface of the fifth trench 620 and may not be formed on a top surface of the element isolation region 205.

The fourth gate electrode 640 may be formed on the eighth insulating film 630 to partially fill the fifth trench 620. The eighth insulating film 630 may include a fifth portion 630a which overlaps the fourth gate electrode 640 and a sixth portion 630b which does not overlap the fourth gate electrode 640. The sixth portion 630b may include the fifth fixed charges 635.

The fifth fixed charges 635 may include, but not limited to, at least one material selected from the group consisting of N, Hf, Zr, La, Mg, B, Al, P, As, Ar and H. The fifth fixed charges 635 may be formed in the sixth portion 630b by using plasma that contains any of the above example elements or by forming a thin film that contains any of the above example elements on the eighth insulating film 830. The fifth fixed charges 635 may be positive or negative charges.

Figure 9:
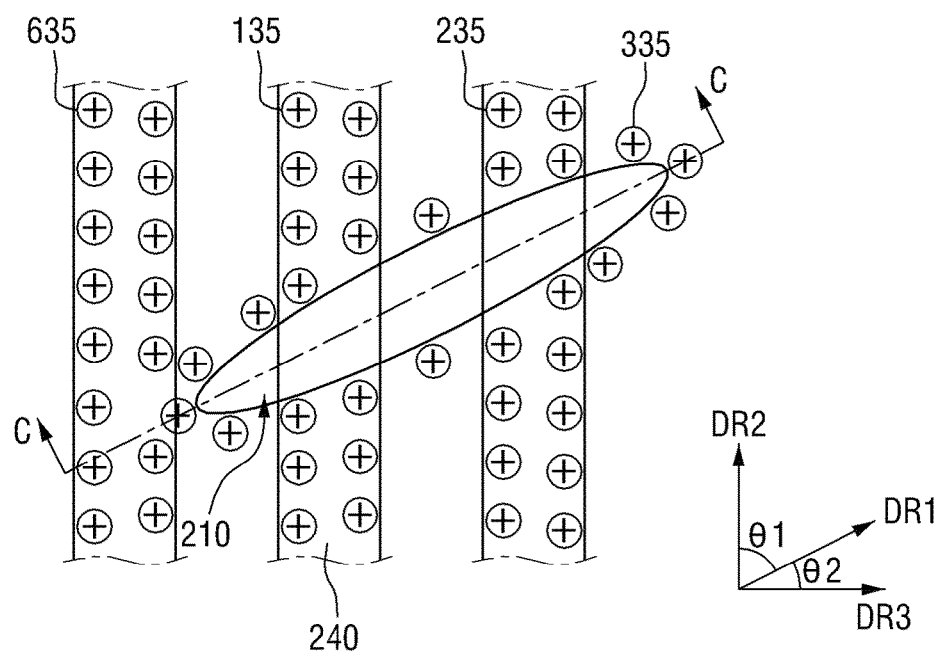
FIG. 9 is a partial layout view of a semiconductor device 7 according to a seventh embodiment.
Figure 10:
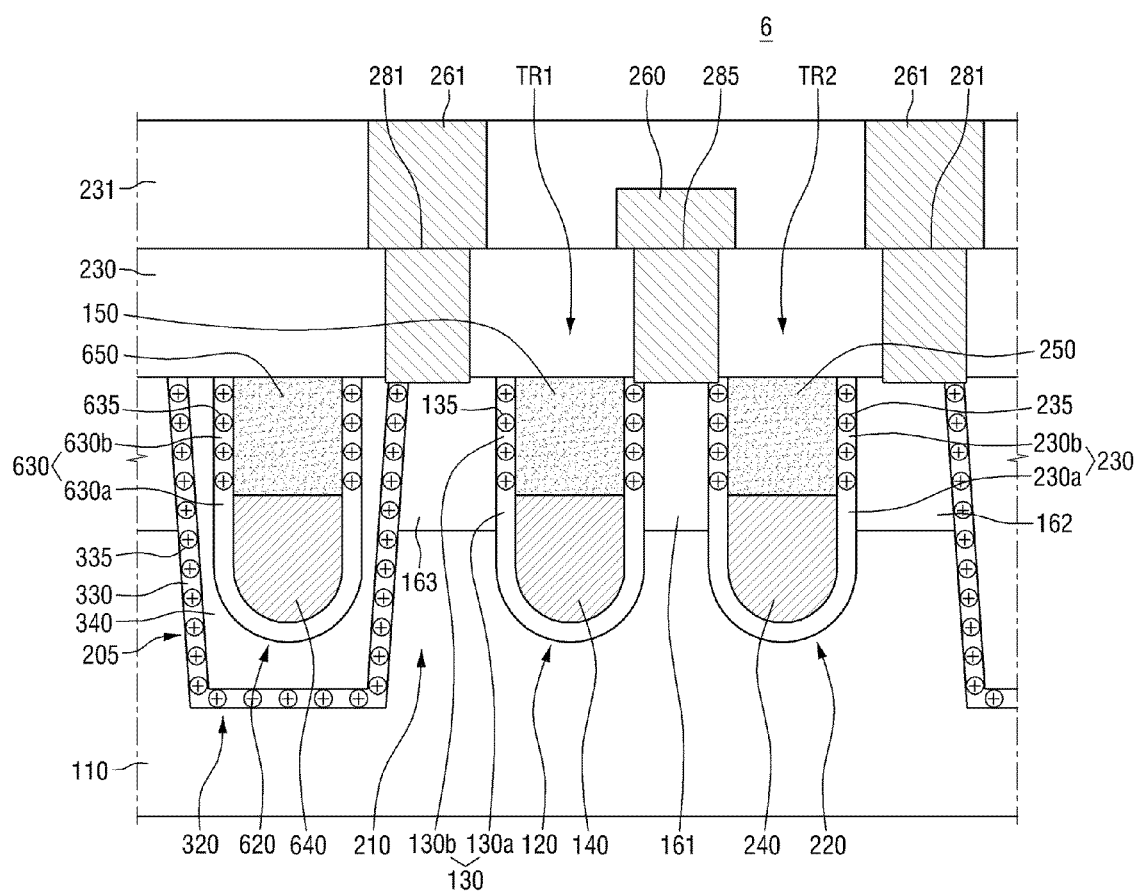
FIG. 10 is a cross-sectional view taken along the line C-C of FIG. 9.

FIG. 9 is a partial layout view of a semiconductor device 7 according to a seventh embodiment. FIG. 10 is a cross-sectional view taken along the line C-C of FIG. 9. For simplicity, the following description will focus on differences from FIGS. 7 and 8.

Referring to FIGS. 9 and 10, in the semiconductor device 7 according to the seventh embodiment of the present exemplary embodiments, an element isolation region 205 may include a third trench 320, a fourth insulating film 330, a fifth insulating film 340, and third fixed charges 335.

The third trench 320 may have various shapes. For example, sidewalls of the third trench 320 may slope at a predetermined angle.

The fourth insulating film 330 may be formed along sidewalls and a bottom surface of the third trench 320. The fourth insulating film 330 is not formed on a top surface of a substrate 110. The fourth insulating film 330 may include at least one of a silicon oxide film, a silicon nitride film, a silicon oxynitride film, and a high-k material. The high-k material may include at least one of $HfO_2$, $ZrO_2$, and $Ta_2O_5$.

The fifth insulating film 340 may be formed in the third trench 320 to completely fill the third trench 320. The fifth insulating film 340 may be, but is not limited to, an oxide film, a nitride film, or an oxynitride film.

The third fixed charges 335 may include, but not limited to, at least one material selected from the group consisting of N, Hf, Zr, La, Mg, B, Al, P, As, Ar and H. For example, the third fixed charges 335 may be formed in a sixth portion 330b by using plasma that contains any of the above example elements or by forming a thin film that contains any of the above example elements on the fourth insulating film 330. Although Ar and H are inert elements, if bonds are broken, dangling bonds are formed. Therefore, Ar and H can be used to form the third fixed charges 335. The third fixed charges 335 may be positive or negative charges.

The third fixed charges 335 can prevent a leakage current from being generated at sidewalls of the element isolation region 205. Referring to FIG. 9, first fixed chares 135 may be formed along a second direction DR2, that is, along a direction in which a first gate electrode 140 extends. Second fixed charges 235 may be formed along the second direction DR2, that is, along a direction in which a second gate electrode 240 extends.

In addition, the third fixed charges 335 may be formed around a unit active region 210. In the drawing, the third fixed charges 335 are formed all around the unit active region 210. However, the present exemplary embodiments are not limited thereto. That is, the third fixed charges 335 can also be formed around part of the unit active region 210. That is, the third fixed charges 335 may be formed only in a necessary region.

Figure 11:
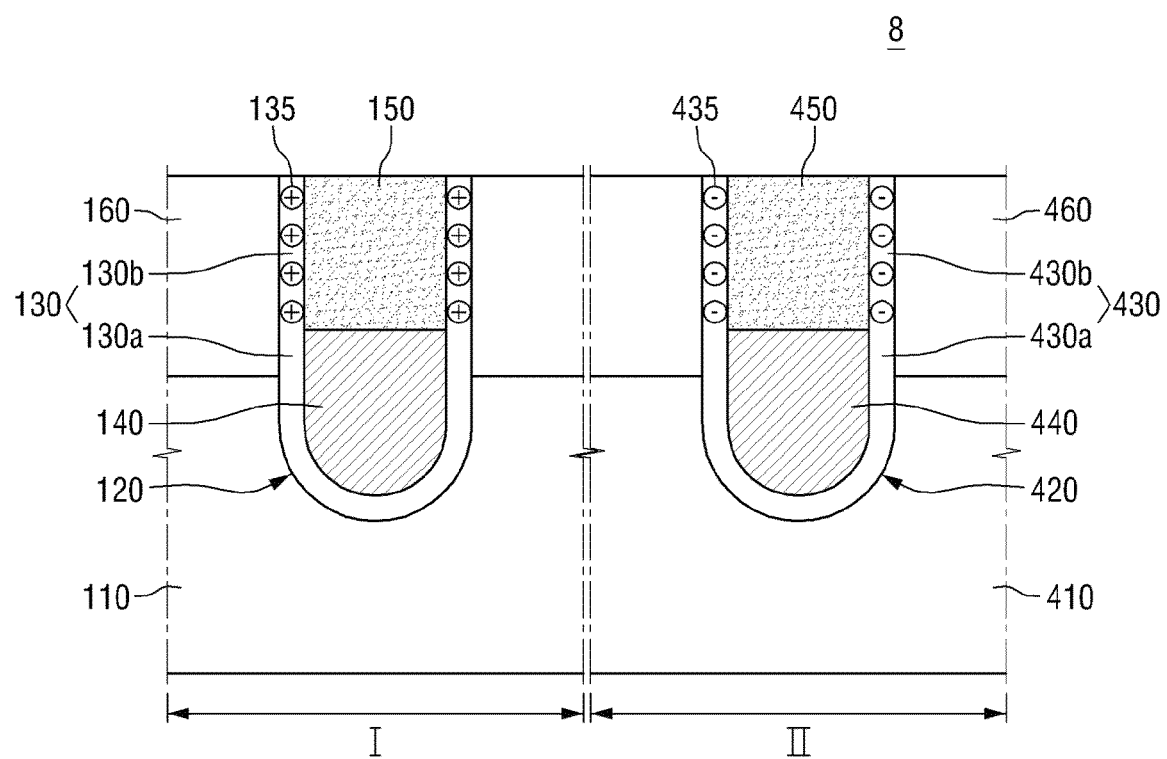
FIG. 11 is a cross-sectional view of a semiconductor device 8 according to an eighth embodiment.

FIG. 11 is a cross-sectional view of a semiconductor device 8 according to an eighth embodiment. For simplicity, the following description will focus on differences from FIGS. 7 and 8.

Referring to FIG. 11, in the semiconductor device 8 according to the eighth embodiment of the present exemplary embodiments, a substrate 110 may be divided into a first region I and a second region II. An N-type transistor may be formed in the first region I, and a P-type transistor may be formed in the second region II.

The N-type transistor formed in the first region I may include a first trench 120, a first insulating film 130, a first gate electrode 140, first fixed charges 135, a first source/drain region 160, and a capping film 150.

The P-type transistor formed in the second region II may include a fourth trench 420, a seventh insulating film 430, a third gate electrode 440, fourth fixed charges 435, a fourth source/drain region 460, and a capping film 450.

The configuration of the P-type transistor formed in the second region II is similar to that of the N-type transistor formed in the first region I.

Here, the first fixed charges 135 may be a different material from the fourth fixed charges 435. For example, the first fixed charges 135 may be positive chares, and the fourth fixed charges 435 may be negative charges. For example, the first fixed charges 135 may be a Group 3 element such as B or Al, and the fourth fixed charges 435 may be a Group 5 element such as P or As.

Figure 12A:
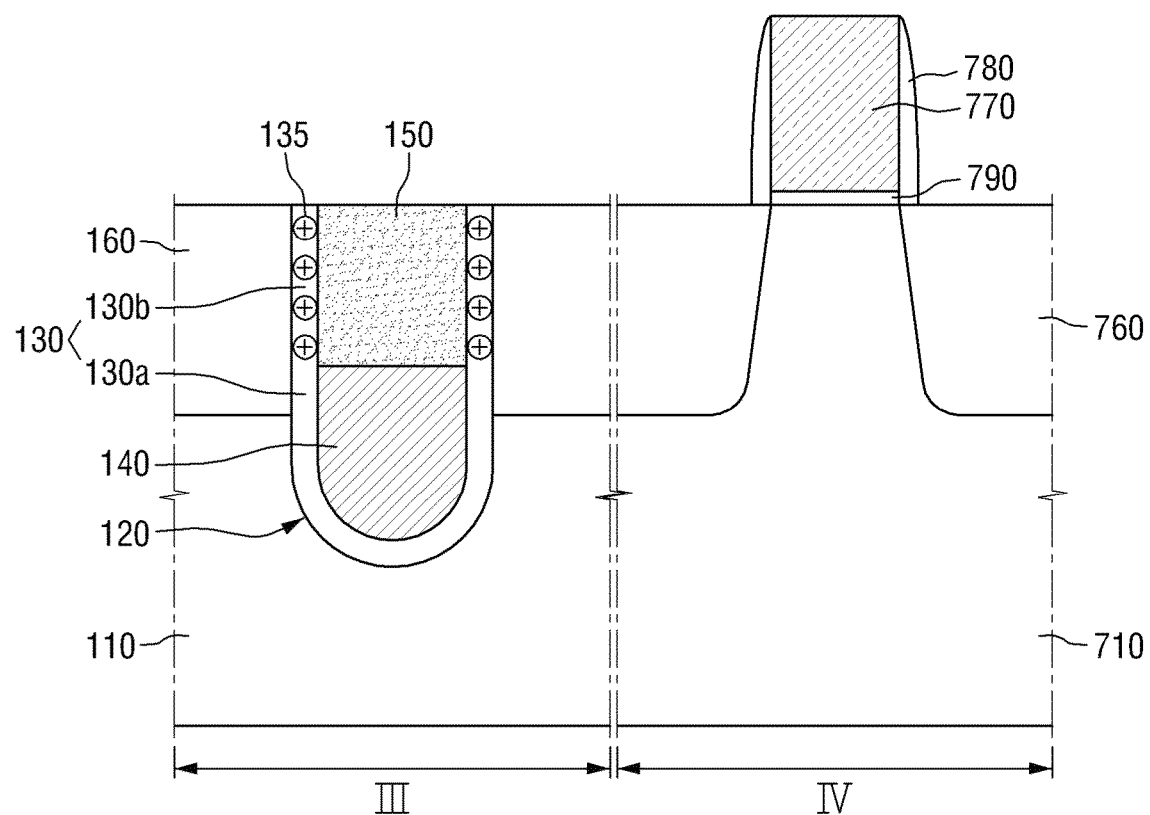
FIGS. 12A and 12B are cross-sectional views of semiconductor devices 9a and 9b according to a ninth embodiment.
Figure 12B:
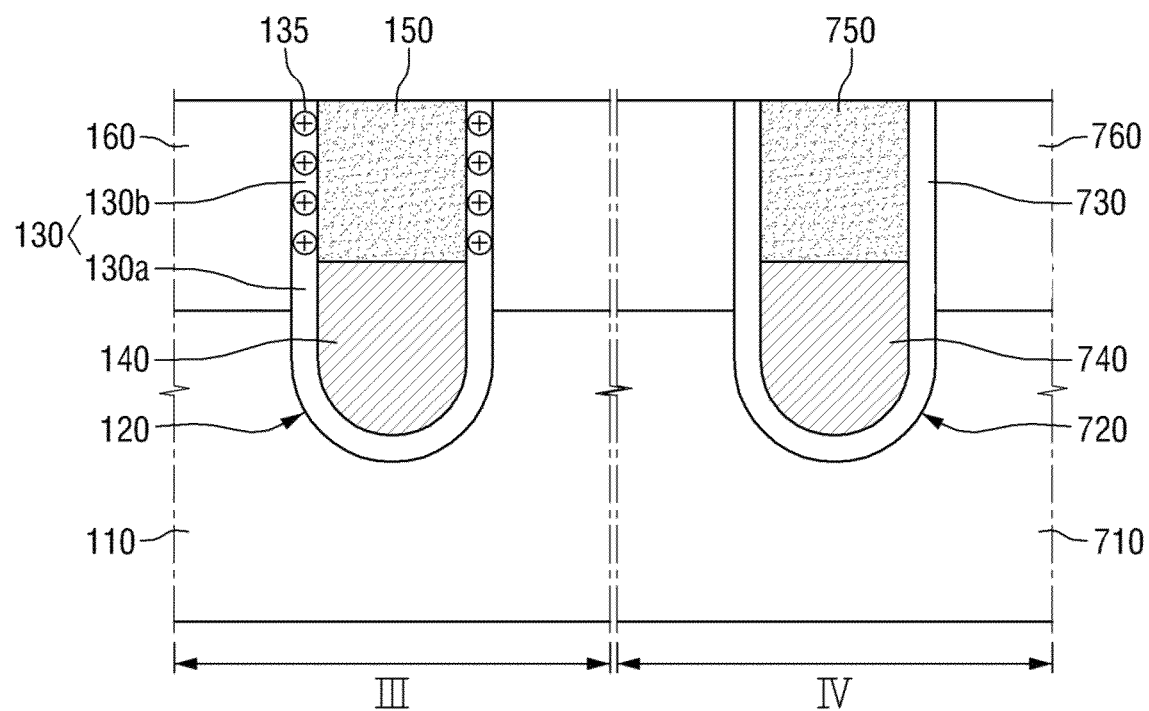

FIGS. 12A and 12B are cross-sectional views of semiconductor devices 9a and 9b according to a ninth embodiment.

Referring to FIGS. 12A and 12B, each of the semiconductor devices 9a and 9b according to the ninth embodiment of the present exemplary embodiments may include a memory region III and a peripheral circuit region IV. At least some of a plurality of transistors formed in the memory region III may include the above-described fixed charges.

On the other hand, a plurality of transistors formed in the peripheral circuit region IV may not include the above-described fixed charges. Referring to FIG. 12A, a planar transistor may be formed in the peripheral circuit region IV. The planar transistor may include a gate electrode 770, a spacer 780, and a gate insulating film 790. The gate electrode 770 may be, but is not limited to, a silicon electrode, a stack of silicon and metal, or a metal. Alternatively, referring to FIG. 12B, a trench-gate transistor may be formed in the peripheral circuit region IV. The trench-gate transistor may include a trench 720, a gate electrode 740, and a gate insulating film 730. That is, in the semiconductor devices 9a and 9b according to the ninth embodiment of the present exemplary embodiments, fixed charges may be formed only in a necessary region.

Figure 13:
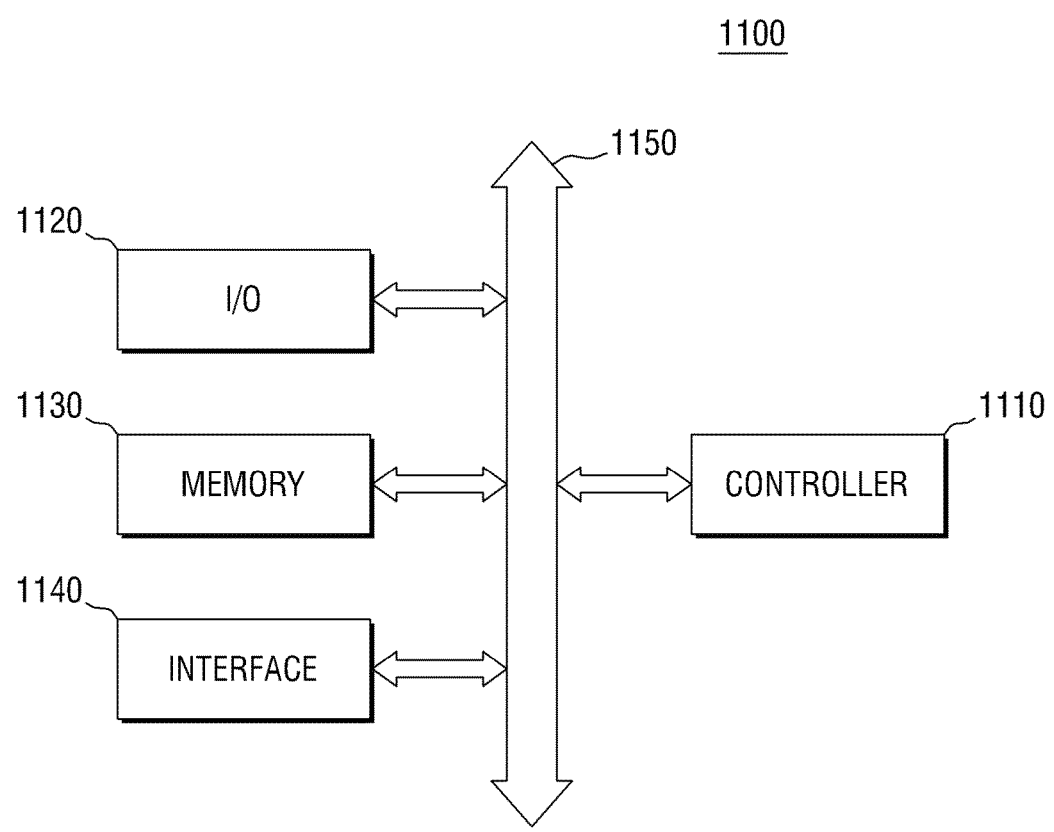
FIG. 13 is a block diagram of an electronic system 1100 including a semiconductor device according to some embodiments.

FIG. 13 is a block diagram of an electronic system 1100 including a semiconductor device according to some embodiments.

Referring to FIG. 13, the electronic system 1100 according to the embodiments of the present exemplary embodiments may include a controller 1110, an input/output (I/O) device 1120, a memory device 1130, an interface 1140, and a bus 1150. The controller 1110, the I/O device 1120, the memory device 1130, and/or the interface 1140 may be coupled to each other through the bus 1150. The bus 1150 corresponds to a path through which data transfer.

The controller 1110 may include at least one of a microprocessor, a digital signal processor, a microcontroller, or logic elements capable of performing similar functions to those of the above elements. The I/O device 1120 may include a keypad, a keyboard, and a display device. The memory device 1130 may store data and/or commands. The memory device 1130 may include any one of the semiconductor devices 1 through 9 according, to the embodiments. The memory device 1130 may include a DRAM. The interface 1140 may transmit data to a communication network or receive data from the communication network. The interface 11140 can be in a wired or wireless form. For example, the interface 1140 may be an antenna or a wired/wireless transceiver.

The electronic system 1100 can be applied to a personal digital assistant (PDA), a portable computer, a web tablet, a wireless phone, a mobile phone, a digital music player, a memory card, and all electronic products that can transmit and/or receive information in a wireless environment.

Figure 14:
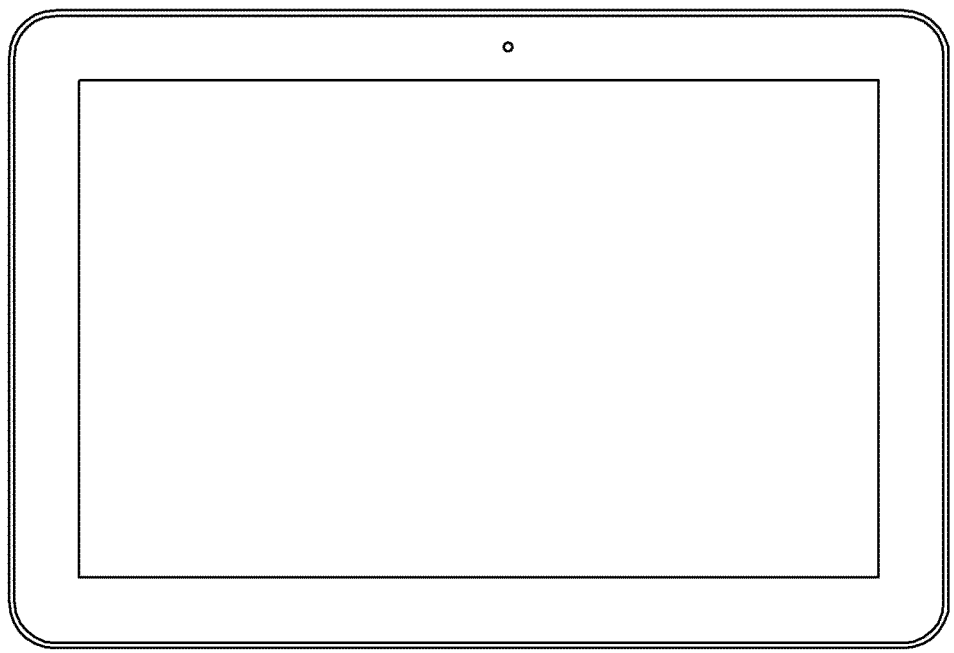
FIGS. 14 and 15 are example semiconductor systems to which semiconductor devices according to some embodiments of the present inventive concept can be applied.
Figure 15:
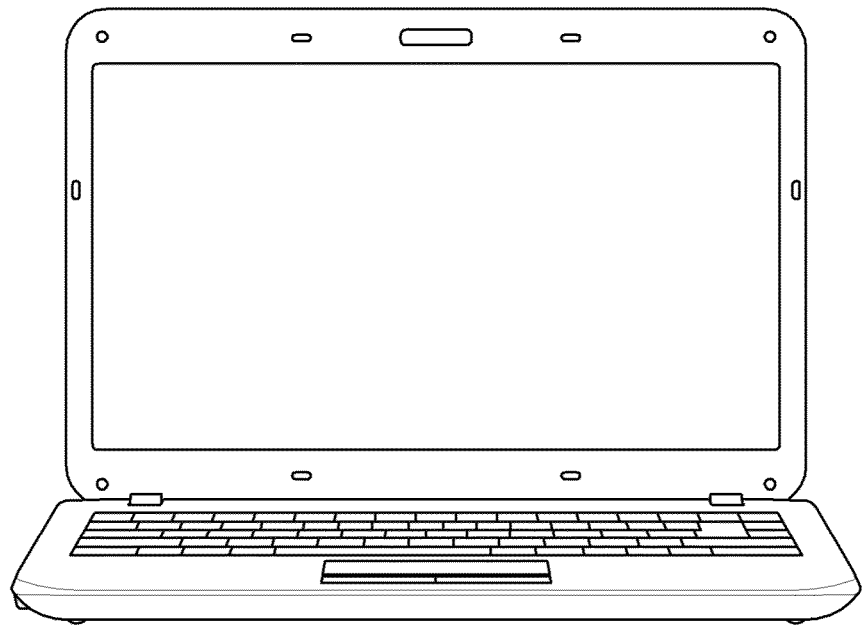

FIGS. 14 and 15 are example semiconductor systems to which semiconductor devices according to some embodiments of the present exemplary embodiments can be applied. FIG. 14 shows a tablet PC, and FIG. 15 shows a notebook computer. It is obvious to those of ordinary skill in the art that the semiconductor devices according to the embodiments of the present exemplary embodiments are also applicable to other integrated circuit devices not shown in the drawings.

A method of fabricating the semiconductor device according to the first embodiment of the present exemplary embodiments will now be described with reference to FIGS. 16 through 20 and 1. FIGS. 16 through 20 are cross-sectional views illustrating intermediate processes included in a method of fabricating the semiconductor device according to the first embodiment.

Figure 16:
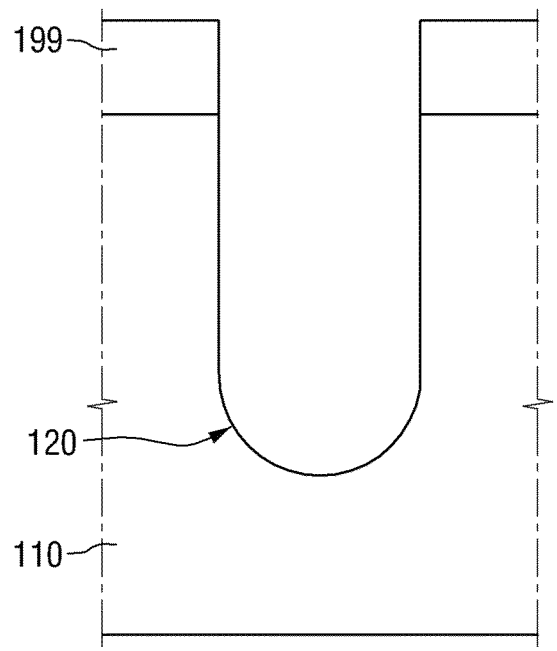
FIGS. 16 through 20 are cross-sectional views illustrating intermediate processes included in a method of fabricating the semiconductor device according to the first embodiment.

Referring to FIG. 16, a mask pattern 199 is formed on a substrate 110. The mask pattern 199 exposes a region in which a first trench 120 is to be formed. The mask pattern 199 may be, but is not limited to, an oxide film, a nitride film, or an oxynitride film.

The first trench 120 is formed in the substrate 110 using the mask pattern 199. The first trench 120 may be formed by dry etching.

Figure 17:
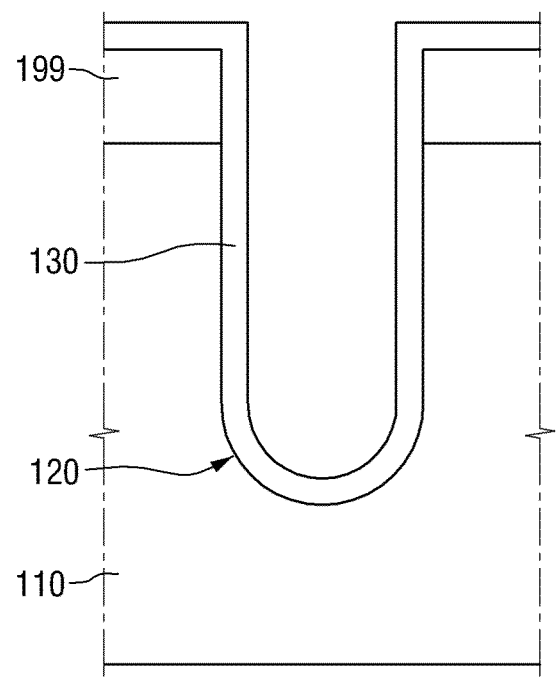

Referring to FIG. 17, a first insulating film 130 is conformally formed along a top surface and sidewalls of the mask pattern 199 and sidewalls and a bottom surface of the first trench 120. The first insulating film 130 may include at least one of a silicon oxide film, a silicon nitride film, a silicon oxynitride film, and a high-k material. The high-k material may include at least one of $HfO_2$, $ZrO_2$, and $Ta_2O_5$.

Figure 18:
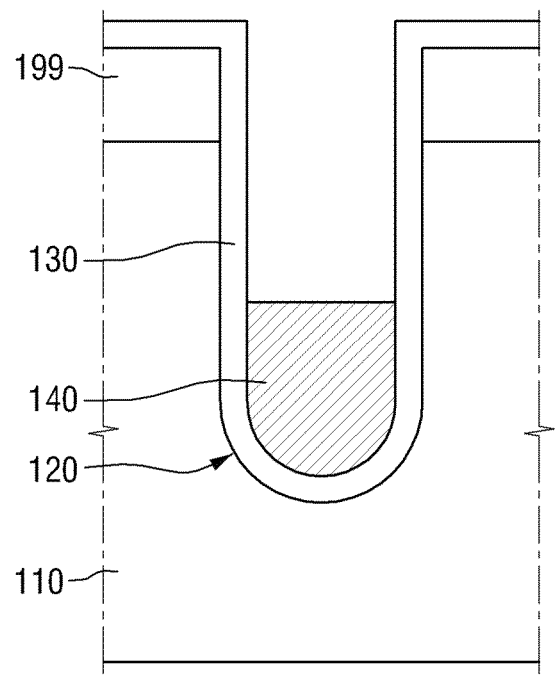

Referring to FIG. 18, a conductive material is formed on the first insulating film 130 to fill the first trench 120. The conductive material may be, e.g., metal or polysilicon.

The conductive material is etched (e.g., etched back), thereby completing a recessed first gate electrode 140.

A top surface of the first gate electrode 140 may be lower than a top surface (a surface) of the substrate 110.

Figure 19:
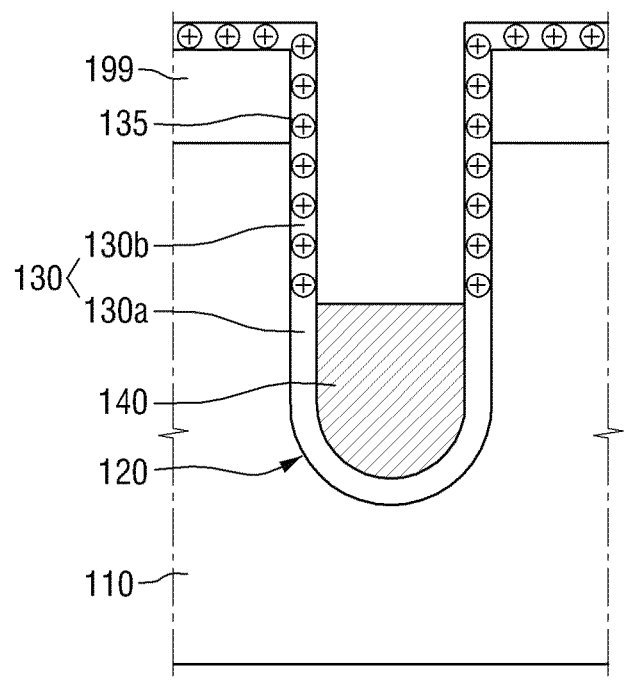

Referring to FIG. 19, first fixed charges 135 are formed in a second portion 130b of the first insulating film 130 and are not formed in a first portion 130a of the first insulating film 130. The first insulating film 130 may include the first portion 130a which overlaps the first gate electrode 140 and the second portion 130b which does not overlap the first gate electrode 140.

Specifically, the first fixed charges 135 may include, but not limited to, at least one material selected from the group consisting of N, Hf, Zr, La, Mg, B, Al, P, As, Ar and H.

The first fixed charges 135 may be formed using plasma that contains any one of the above example elements. For example, to form nitrogen (N) fixed charges, plasma nitridation may be used.

Figure 20:
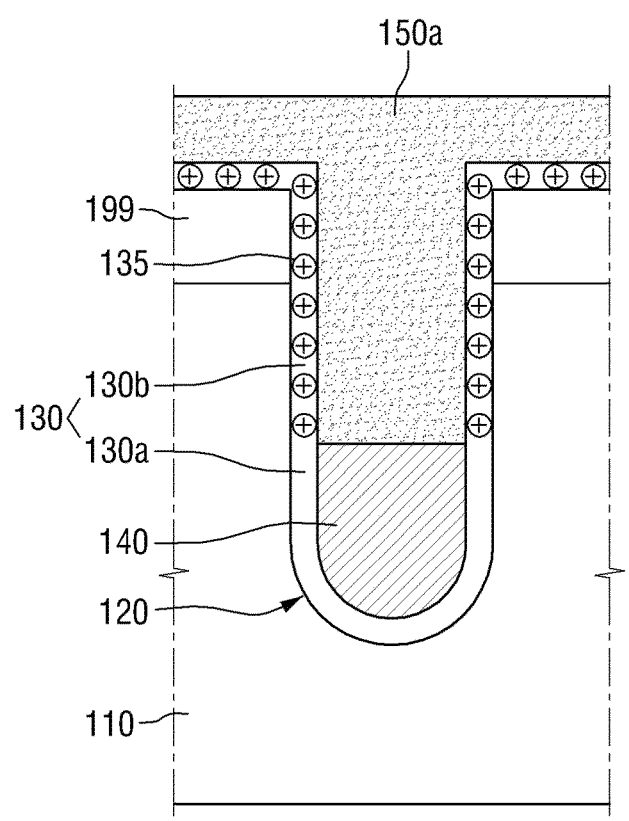

Referring to FIG. 20, a capping film 150 is formed on the first gate electrode 140 to fill the first trench 120.

The capping film 150 mat be, but is not limited to, an oxide film, a nitride film, or an oxynitride film. Here, a case where the capping film 150 is a nitride film will be described as an example.

Referring back to FIG. 1, the mask pattern 199 is removed.

Specifically, part of the capping film 150 and the whole of the mask pattern 199 may be removed using a planarization process. Here, part of the first insulating film 130 formed on the top surface and sidewalls of the mask pattern 199 is removed. Consequently, the first insulating film 130 remains only on the sidewalls and bottom surface of the first trench 120 formed in the substrate 110. Thus, the first insulating film 130 does not exist on the top surface of the substrate 110.

Figure 21:
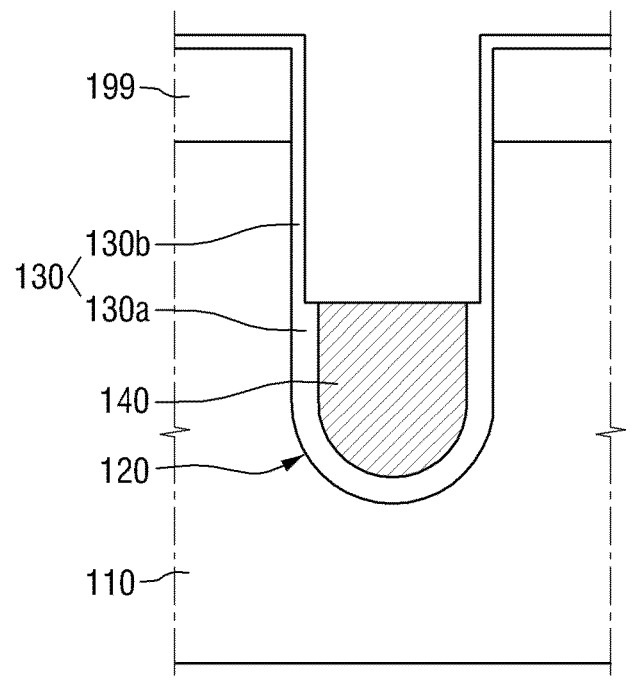
FIGS. 21 and 22 are cross-sectional views illustrating intermediate processes included in a method of fabricating the semiconductor device according to the second embodiment.
Figure 22:
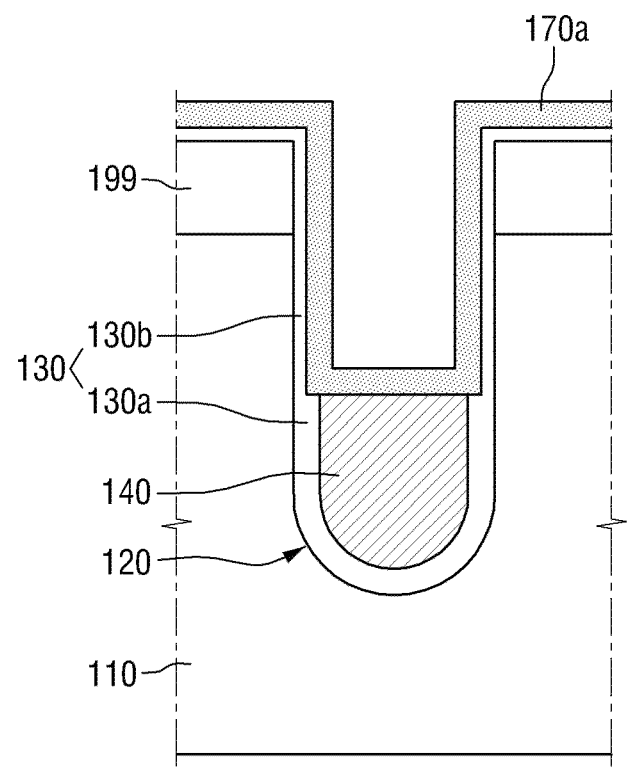

A method of fabricating the semiconductor device according to the second embodiment of the present exemplary embodiments will now be described with reference to FIGS. 21, 22, 2 and 3. FIGS. 21 and 22 are cross-sectional views illustrating intermediate processes included in a method of fabricating the semiconductor device according to the second embodiment.

A mask pattern 199 is formed on a substrate 110, and a first trench 120 is formed using the mask pattern 199 (see FIG. 16).

Then, a first insulating film 130 is conformally formed along a top surface and sidewalls of the mask pattern 199 and sidewalls and a bottom surface of the first trench 120 (see FIG. 17).

A recessed first gate electrode 140 is formed on the first insulating film 130 in the first trench 120 (see FIG. 18).

Referring to FIG. 21, a second portion 130b of the first insulating film 130 is partially etched. Thus, as described above with reference to FIGS. 2 and 3, a second thickness W2 of the second portion 130b may be smaller than a first thickness W1 of the first portion 130a. Since the first portion 130a of the first insulating film 130 is covered with the first gate electrode 140, it may not be etched.

Referring to FIG. 22, a second insulating film 170a is formed on the first insulating film 130.

As shown in the drawing, the second insulating film 170a may be formed along the top surface and side surfaces of the mask pattern 199 and exposed portions of the sidewalls of the first trench 120. The second insulating film 170a may be a thin film that includes at least one material selected from the group consisting of N, Hf, Zr, La, Mg, B, Al, P, As, Ar and H. By forming the second insulating film 170a along the first insulating film 130, first fixed charges 135 can be formed in the first insulating film 130. For example, if the second insulating film 170a is a nitride film, the first fixed charges 135 may be formed in the first insulating film 130 in a process of forming the nitride film. The nitride film may be formed using, e.g., $SiH_4$ and $NH_3$. Here, if preprocessing is performed using a high concentration of $NH_3$, the first fixed charges 135 may be formed in the first insulating film 130.

Referring back to FIGS. 2 and 3, a capping film 150 is formed on the second insulating film 170a to fill the first trench 120. Part of the capping film 150, part of the second insulating film 170a, and the whole of the mask pattern 199 may be removed using a planarization process.

While the methods of fabricating the semiconductor devices according to only the first and second embodiments of the present exemplary embodiments have been described above, those of ordinary skill in the art to which the present exemplary embodiments pertains can infer methods of fabricating the semiconductor devices according to the other embodiments of the present exemplary embodiments from the above fabrication methods.

What is claimed is:

1. A semiconductor device comprising:
    a substrate comprising a source and drain region;
    a trench disposed adjacent to the source and drain region;
    an insulating film disposed inside the a gate electrode disposed at a lower portion of the trench,
    wherein the insulating film includes fixed charges, the fixed charges being inserted into or formed in the insulating film,
    wherein an electrical field induced from the fixed charges reduces leakage current in the source and drain region, and
    wherein the fixed charges are provided only in a portion of the insulating film disposed adjacent to the source and drain region.

2. The semiconductor device of claim 1, wherein the substrate further comprises a body and wherein the leakage current corresponds to at least one of gate induced drain leakage current and junction leakage current between a drain of the source and drain region and the body.

3. The semiconductor device of claim 2, wherein the insulating film comprises a first portion and a second portion disposed above the first portion, and wherein the fixed charges are disposed in the second portion which extends toward a top of the gate electrode.

4. The semiconductor device of claim 3, wherein the insulating film extends along an inside of the trench.

5. The semiconductor device of claim 4, wherein the trench extends through the source and drain region of the substrate and extends further into the substrate beneath the source and drain region.

6. The semiconductor device of claim 5, wherein a top of the gate electrode extends vertically to overlap with the source and drain region of the substrate.

7. The semiconductor device of claim 6 further comprising a cap film disposed over the gate electrode.

8. The semiconductor device of claim 7, wherein the cap film comprises:
a high-k portion; and
a low-k portion disposed on the high-k portion.

9. The semiconductor device of claim 2 further comprising a cap film disposed over the gate electrode,
wherein the insulating film comprises a first insulating film and a second insulating film, the second insulating film lining an inside surface of the first insulating film and a lower portion of the second insulating film disposed between the gate electrode and the cap film, and
wherein the second insulating film includes the fixed charges.

10. The semiconductor device of claim 9, wherein the first insulating film comprises a first portion and a second portion disposed above the first portion,
wherein the second insulating film lines the inside surface of the second portion of the first insulating film, and
wherein a thickness of the second portion of the first insulating film is less than a thickness of the first portion of the first insulating film disposed below the second portion.

11. The semiconductor device of claim 9, wherein the first insulating film comprises a first portion and a second portion disposed above the first portion,
wherein the second insulating film lines the inside surface of the second portion of the first insulating film, and
wherein a thickness of the second portion of the first insulating film is substantially equal to a thickness of the first portion of the first insulating film disposed below the second portion.

12. The semiconductor device of claim 3, wherein a cross-sectional shape of the first portion of the insulating film is bulbous-shaped.

13. The semiconductor device of claim 3, wherein the insulating film includes the fixed charges from the top of the source and drain region of the substrate to a depth d.

14. The semiconductor device of claim 1, wherein the fixed charges are vertically disposed in the insulating film up to a top of the trench and not disposed over the source and drain region.

15. The semiconductor device of claim 1, wherein the trench is a first trench, the insulating film is an inner insulating film, and the fixed charges are inner fixed charges and
the semiconductor device further comprises:
an outer trench, the inner trench being disposed in the outer trench, and
an outer insulating film lining an inside surface of the outer trench.

16. The semiconductor device of claim 15, wherein the outer insulating film includes outer fixed charges inserted into or formed in the outer insulating film.

17. The semiconductor device of claim 16, wherein the outer fixed charges are inserted into the outer insulating film using plasma or formed by depositing a material to form a film including the fixed charges.

18. The semiconductor device of claim 1, wherein the fixed charges comprise at least one material selected from N, Hf, Zr, La, Mg, B, Al, P, As, Ar and H.

19. The semiconductor device of claim 1, wherein the fixed charges are injected into the insulating film comprising inherent charges.

* * * * *